United States Patent
Dama et al.

(10) Patent No.: US 8,370,557 B2
(45) Date of Patent: Feb. 5, 2013

(54) PSEUDO DUAL-PORT SRAM AND A SHARED MEMORY SWITCH USING MULTIPLE MEMORY BANKS AND A SIDEBAND MEMORY

(75) Inventors: Jonathan Dama, Pasadena, CA (US); Andrew Lines, Malibu, CA (US)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 12/340,022

(22) Filed: Dec. 19, 2008

(65) Prior Publication Data

US 2010/0161892 A1     Jun. 24, 2010

(51) Int. Cl.
*G06F 13/00* (2006.01)
*G06F 12/00* (2006.01)
*G11C 11/413* (2006.01)

(52) U.S. Cl. ... 711/5; 711/149; 365/230.03; 365/230.05
(58) Field of Classification Search ............ 711/5, 104, 711/149, 157, 169; 365/230.03, 230.05
See application file for complete search history.

(56) References Cited

U.S. PATENT DOCUMENTS

| | | | | |
|---|---|---|---|---|
| 5,561,781 A * | 10/1996 | Braceras et al. | | 711/131 |
| 5,752,070 A | 5/1998 | Martin et al. | | 712/33 |
| 5,790,461 A | 8/1998 | Holst | | 365/189.04 |
| 6,038,656 A | 3/2000 | Martin et al. | | 712/211 |
| 6,189,073 B1 * | 2/2001 | Pawlowski | | 711/120 |
| 6,349,378 B1 | 2/2002 | Duranton et al. | | 712/28 |
| 6,446,249 B1 | 9/2002 | Wang et al. | | 326/38 |
| 6,505,323 B1 | 1/2003 | Lipton et al. | | 716/112 |
| 6,519,204 B2 | 2/2003 | Slamowitz et al. | | 365/230.05 |
| 6,614,438 B1 | 9/2003 | Bru | | 345/520 |
| 6,732,336 B2 | 5/2004 | Nystrom et al. | | 716/104 |
| 6,944,731 B2 * | 9/2005 | Bouchard et al. | | 711/161 |
| 7,050,324 B2 | 5/2006 | Cummings et al. | | 365/154 |
| 7,349,285 B2 * | 3/2008 | Balasubramanian et al. | | 365/230.05 |
| 8,121,150 B1 * | 2/2012 | Nelson | | 370/471 |
| 2003/0088694 A1 * | 5/2003 | Patek et al. | | 709/238 |
| 2003/0146073 A1 | 8/2003 | Cummings et al. | | 200/1 R |
| 2003/0151426 A1 | 8/2003 | Islam | | 326/37 |
| 2003/0159078 A1 | 8/2003 | Davies et al. | | 713/400 |
| 2006/0012603 A1 * | 1/2006 | Lindholm et al. | | 345/543 |
| 2006/0155938 A1 | 7/2006 | Cummings et al. | | 711/149 |
| 2006/0221945 A1 * | 10/2006 | Chin et al. | | 370/381 |
| 2007/0109909 A1 * | 5/2007 | Jung | | 365/233.5 |
| 2009/0003119 A1 * | 1/2009 | Guo et al. | | 365/230.05 |

OTHER PUBLICATIONS

Iwabuchi et al, "A 1.5 ns Cycle-Time 18-kb Pseudo Dual Port RAM With 9K Logic gates," IEEE Journal of Solid State Circuits, vol. 29, No. 4, Apr. 1994, pp. 419-425.*

Sumita et al, "A 32b 64-Word 9-Read-Port/7-Write-Port Pseudo Dual Bank Register File Using Copied Memory Cells for a Multi-Threaded Processor," 2005 Int'l. Solid State Circuits Conference, Feb. 10, 2005, pp. 384-385, 605.*

(Continued)

*Primary Examiner* — Sanjiv Shah
*Assistant Examiner* — Glenn Gossage
(74) *Attorney, Agent, or Firm* — Blakely, Sokoloff, Taylor & Zafman LLP

(57) ABSTRACT

A memory is described which includes a main memory array made up of multiple single-ported memory banks connected by parallel read and write buses, and a sideband memory equivalent to a single dual-ported memory bank. Control logic and tags state facilitates a pattern of access to the main memory and the sideband memory such that the memory performs like a fully provisioned dual-ported memory capable of reading and writing any two arbitrary addresses on the same cycle.

10 Claims, 8 Drawing Sheets

OTHER PUBLICATIONS

Dama et al, "GHz Asynchronous SRAM in 65nm," 15th IEEE Symposium on Asynchronous Circuits and Systems, May 17-20, 2009, pp. 85-94.*

Alain Martin, "The limitations to delay-insensitivity in asynchronous circuits," *Sixth MIT Conference on Advanced Research in VLSI*, W.J. Dally, Ed. MIT Press, 1990.

U.V. Cummings, et al., "An Asynchronous Pipelined Lattice Structure Filter", *Advanced Research in Asynchronous Circuits and Systems*, IEEE Computer Society Press, 1994.

A.J. Martin, et al., "The Design of an Asynchronous MIPS R3000 Processor," *Proceedings of the $17^{th}$ Conference on Advanced Research in VLSI*, IEEE Computer Society Press, 1997.

A.J. Martin, et al., "Three Generations of Asynchronous Microprocessors", *IEEE Design Test of Computers, special issue on Clockless VLSI Design*, Nov./Dec. 2003.

F. Baskett, et al., "Interference in Multiprocessor Computer Systems with Interleaved Memory", *Communications of the ACM*, vol. 19, No. 6, Jun. 1976.

D.W.L. Yen, et al., "Memory Interference in Synchronous Multiprocessor Systems", *IEEE Trans. Comput.*, vol. C031, No. 11, Nov. 1982.

K.A. Robbins, et al., "Buffered Banks in Multiprocessor Systems", *IEEE Trans. Comput.*, vol. 44, No. 4, Apr. 1995.

A. Seznec, "Design Tradeoffs for the Alpha EV8 Conditional Branch Predictor", *29th Annual International Symposium on Computer Architecture*, 2002.

M.Y. Hsiao, "A Class of Optimal Minimum Odd-weight-column SEC-DED Codes", *IBM Journal of Research and Development*, Jul. 1970.

Andrew Matthew Lines, *Pipelined Asynchronous Circuits*, Jun. 1995, revised Jun. 1998, pp. 1-37.

Alain J. Martin, *Compiling Communicating Processes into Delay-Insensitive VLSI Circuits*, Dec. 31, 1985, Department of Computer Science California Institute of Technology, Pasadena, California, pp. 1-16.

Alain J. Martin, *Erratum: Synthesis of Asynchronous VLSI Circuits*, Mar. 22, 2000, Department of Computer Science California Institute of Technology, Pasadena, California, pp. 1-143.

International Search Report and Written Opinion dated Jul. 14, 2010, PCT Application No. PCT/US2009/067663.

\* cited by examiner

PSEUDO DUAL-PORT SRAM AND A SHARED MEMORY SWITCH USING MULTIPLE MEMORY BANKS AND A SIDEBAND MEMORY

BACKGROUND OF THE INVENTION

The present invention relates to memories which allow simultaneous read and write operations per cycle while using single-ported memory banks.

In a shared memory switch, one of the bottlenecks that limits the switch's bandwidth is the speed of the memory. In the worst case, a particular memory location may need to be written and read on every packet. Therefore, to have a fully-provisioned switch for a given bandwidth using single-ported static random access memory (SRAM) cells, the operating speed of the memory must be twice as fast as the desired packet-rate.

Alternatively, the required speed of the memory may be cut in half by using dual-ported SRAM cells which allow two operations (i.e., a read and a write) per cycle. However, this requires as much as two times the silicon area compared to a single ported SRAM.

SUMMARY OF THE INVENTION

According to various embodiments of the present invention, a memory system is provided that includes a main memory having a plurality of single-ported memory banks, each memory bank having a first number of entries. Parallel busses are configured to enable simultaneous writing and reading from different ones of the single-ported memory banks. A sideband memory having the first number of entries is provided. Each of the entries in the sideband memory maps to a corresponding one of the entries in one of the memory banks in the main memory. The sideband memory is configured to allow parallel read and write accesses to the sideband memory per cycle. Switching circuitry is configured to direct read and write operations to either the main memory or the sideband memory. Control logic is configured to track to which of the memory banks in the main memory each of the entries in the sideband memory corresponds, and to deterministically control the switching circuitry in response to memory address information to effect a pattern of access to the main memory and the sideband memory such that the memory system performs like a fully provisioned dual-ported memory.

According to one class of embodiments, the sideband memory is implemented as a dual-ported array capable of a read and write to different addresses on the same cycle.

According to another class of embodiments, the sideband memory includes first and second single-ported arrays in parallel, each of which includes the first number of entries. Both of each corresponding pair of entries in the first and second single-ported arrays map to the corresponding one of the entries in one of the memory banks in the main memory. Only one of each corresponding pair of entries in the first and second single-ported arrays is valid. The control logic is configured to track which of each corresponding pair of entries is valid.

According to yet another class of embodiments, the control logic includes a tags memory that identifies the memory bank in the main memory to which each of the entries in the sideband memory corresponds. The tags memory is configured to allow three memory accesses to the tags memory per cycle, e.g., two reads and one write. According to some of this class of embodiments, the tags memory is implemented as a triple-ported array.

According to others of this class of embodiments, the tags memory is implemented with first and second dual-ported arrays in parallel, each of which has the first number of entries, wherein write operations to the tags memory write the same value to both of each corresponding pair of entries in the first and second dual-ported arrays, and wherein first and second simultaneous read operations read from the first and second dual-ported memories, respectively.

Further embodiments are contemplated in which memories implemented in accordance with any embodiment of the invention are used to implement shared-memory switches as well as switch fabrics including a plurality of interconnected instances of such shared-memory switches.

A further understanding of the nature and advantages of the present invention may be realized by reference to the remaining portions of the specification and the drawings.

DETAILED DESCRIPTION OF SPECIFIC EMBODIMENTS

Figure 1:
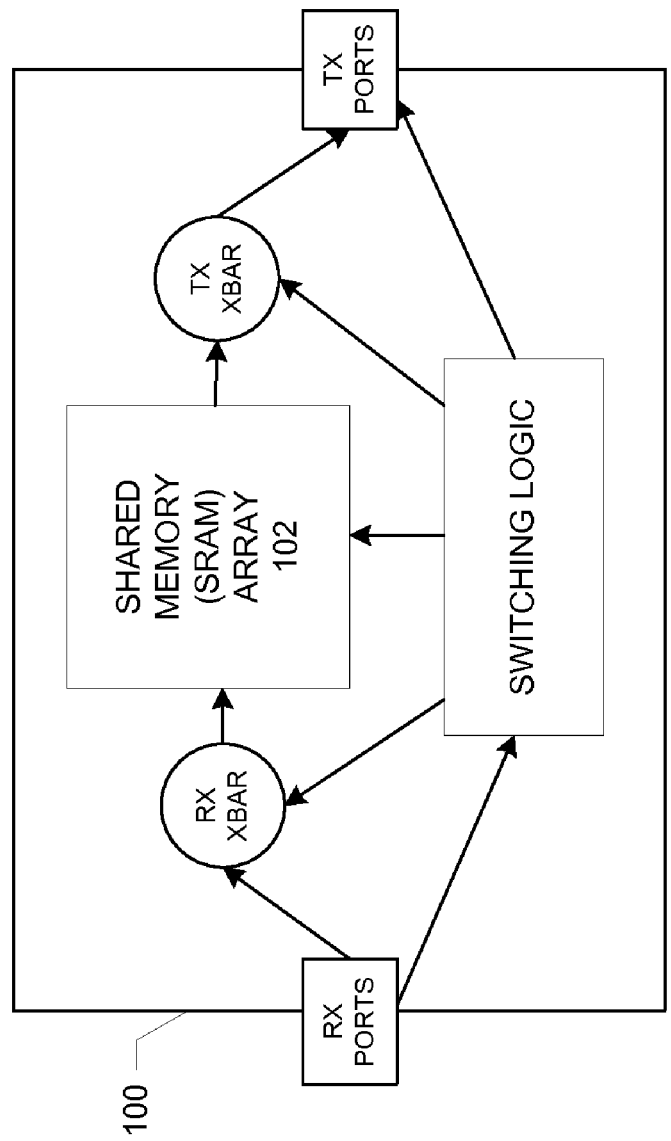
FIG. 1 is a simplified block diagram of an shared memory switch fabric that requires a double-frequency or dual-ported shared memory.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

According to various embodiments of the invention, dual-ported performance is achieved using multiple banks of single-ported memories by providing an alternative pathway through the memory to deal with the case where simultaneous read and write operations are directed to the same memory banks. The single-ported banks are connected by dual-ported data, address, and control busses which can write from one bank and read from another bank simultaneously. However, since the banks themselves are only single-ported, this system cannot read and write from the same bank on the same cycle.

As will be discussed, embodiments of the present invention provide mechanisms to avoid these bank conflicts while maintaining unrestricted dual-ported access externally.

Embodiments of the invention may be used to implement asynchronous SRAMs such as those described, for example, in U.S. Pat. No. 7,050,324 for Asynchronous Static Random Access Memory issued May 23, 2006, the entire disclosure of which is incorporated herein by reference. However, it should be understood that, while embodiments of the invention are well suited for some asynchronous design styles, the basic principles of the present invention are very much applicable to synchronous memory designs, and therefore synchronous memory designs and the devices and systems employing them are within the scope of the present invention.

Particular embodiments of the present invention may also be used to implement shared-memory switches and/or switch fabrics comprising multiple instances of such shared-memory switches. Examples of shared-memory switches in which embodiments of the present invention may be implemented are described in U.S. Patent Publication No. US 2006-0155938 A1 for Shared-Memory Switch Fabric Architecture published Jul. 13, 2006, the entire disclosure of which is incorporated herein by reference for all purposes. More generally, the basic principles of the invention may be employed to implement shared-memory switches and switch fabric architectures in a variety of contexts. That is, the present invention may be implemented for virtually any protocol or interconnect technology including, for example, Ethernet, Serial Rapid Input/Output (I/O), Advanced Switching, any streaming protocol (e.g., Time Division Multiplexing (TDM), System Packet Interface-4 (SPI-4)), any higher layer protocol (e.g., Transmission Control Protocol/Internet Protocol (TCP/IP)), and any application tunneling one protocol over another (e.g., Hypertransport over Ethernet).

Still more generally, it will be understood that the invention should not be limited by references to SRAM technology, shared-memory switches, or related applications. Rather, embodiments of the present invention may be employed to address the limitations of single-ported memories in any context in which such limitations arise.

Figure 3:
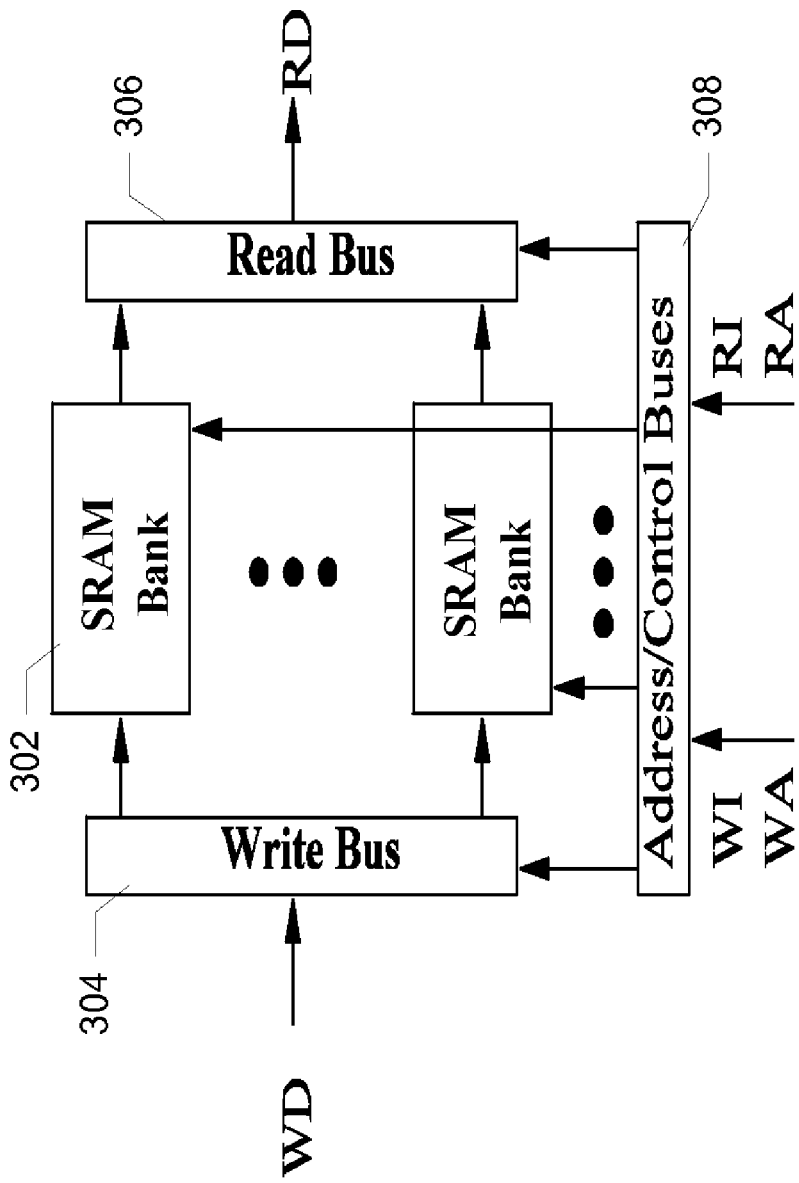
FIG. 3 is a block diagram of a main SRAM array of single ported banks connected with parallel read and write buses.

FIG. 1 shows a simplified block diagram of a shared-memory switch 100 which includes an SRAM array 102 as the shared memory array. SRAM array 102 is implemented with a main memory array of SRAM banks 0 to B-1 (e.g., banks 302 of FIG. 3), each of which is implemented with single-ported SRAM cells. It will be understood that the number of banks shown in the drawing is for illustrative purposes, and that any arbitrary number of banks may be used. Dual-ported buses and address distribution (e.g., buses 304, 306, and 308 of FIG. 3) are provided so that simultaneous operations may occur with different banks However, because single-ported SRAM cells are used to implement the main memory banks, only one access (i.e., read or write) may occur to a given memory bank at a given time.

As will be discussed, a secondary "sideband" or cache memory is provided as a parallel structure to the main memory to resolve bank conflicts between simultaneous read and write operations. According to various embodiments, the sideband memory is the same size, i.e., has the same number of memory cells, as one of the SRAM banks in the main memory. According to specific embodiments, the sideband memory is implemented with dual-ported SRAM cells, and therefore supports simultaneous reads and writes. However, as will be discussed, embodiments of the invention are contemplated in which sideband memory is implemented using single-ported memory cells.

Figure 2A:
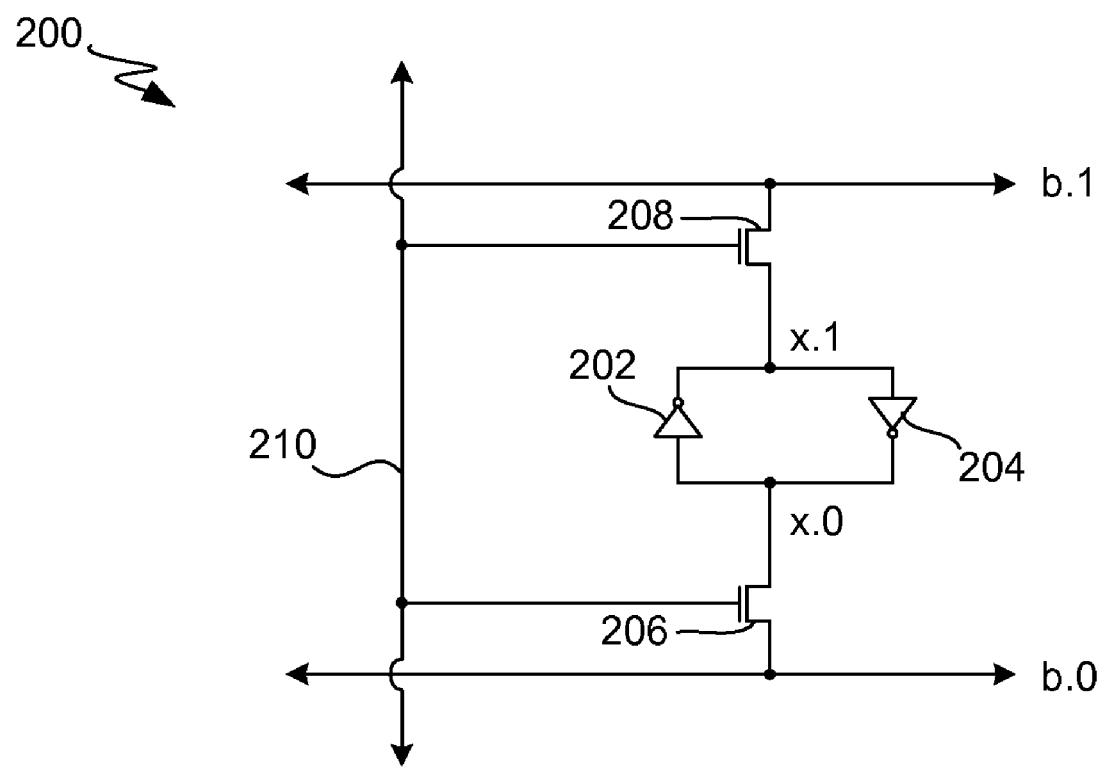
FIGS. 2A-2C are circuit diagrams of single-ported (FIG. 2A) and dual-ported (FIG. 2B and FIG. 2C) SRAM memory cells which may be used with various embodiments of the invention.
Figure 2B:
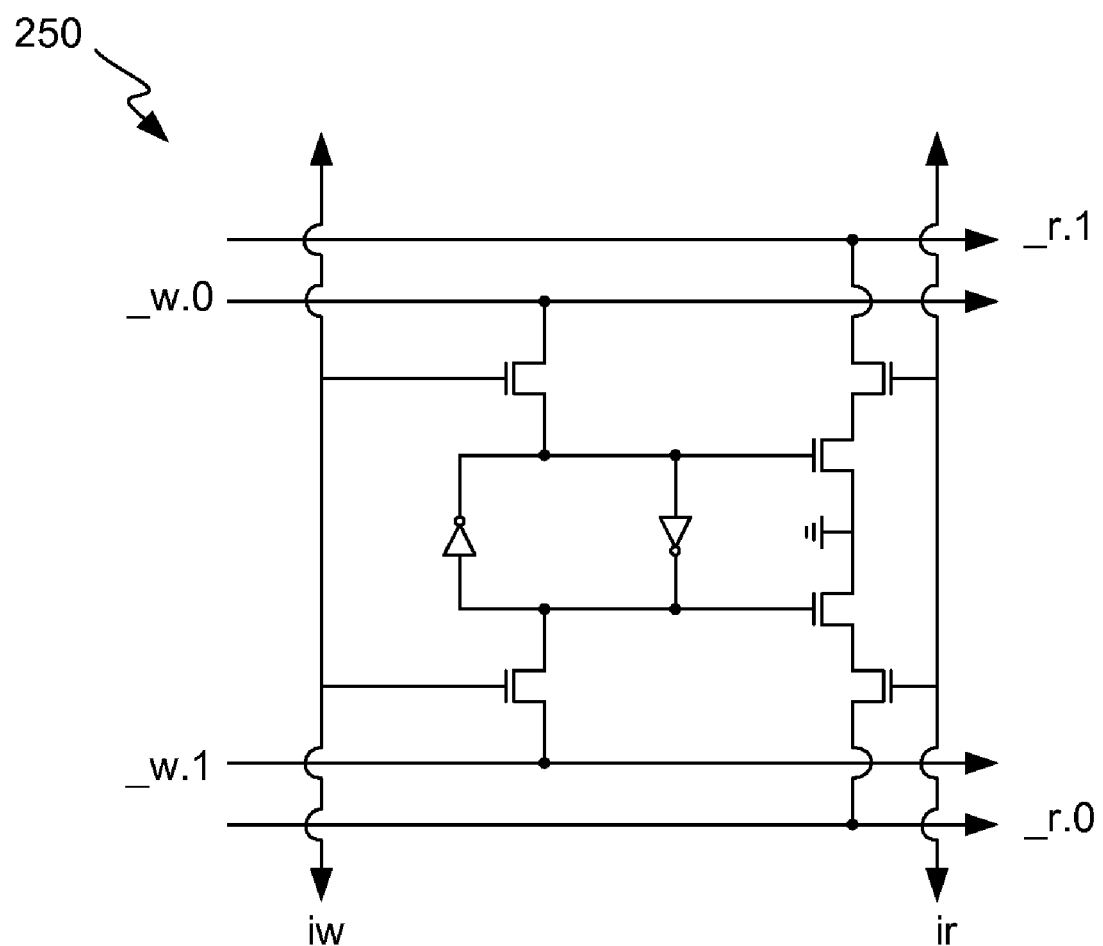
Figure 2C:
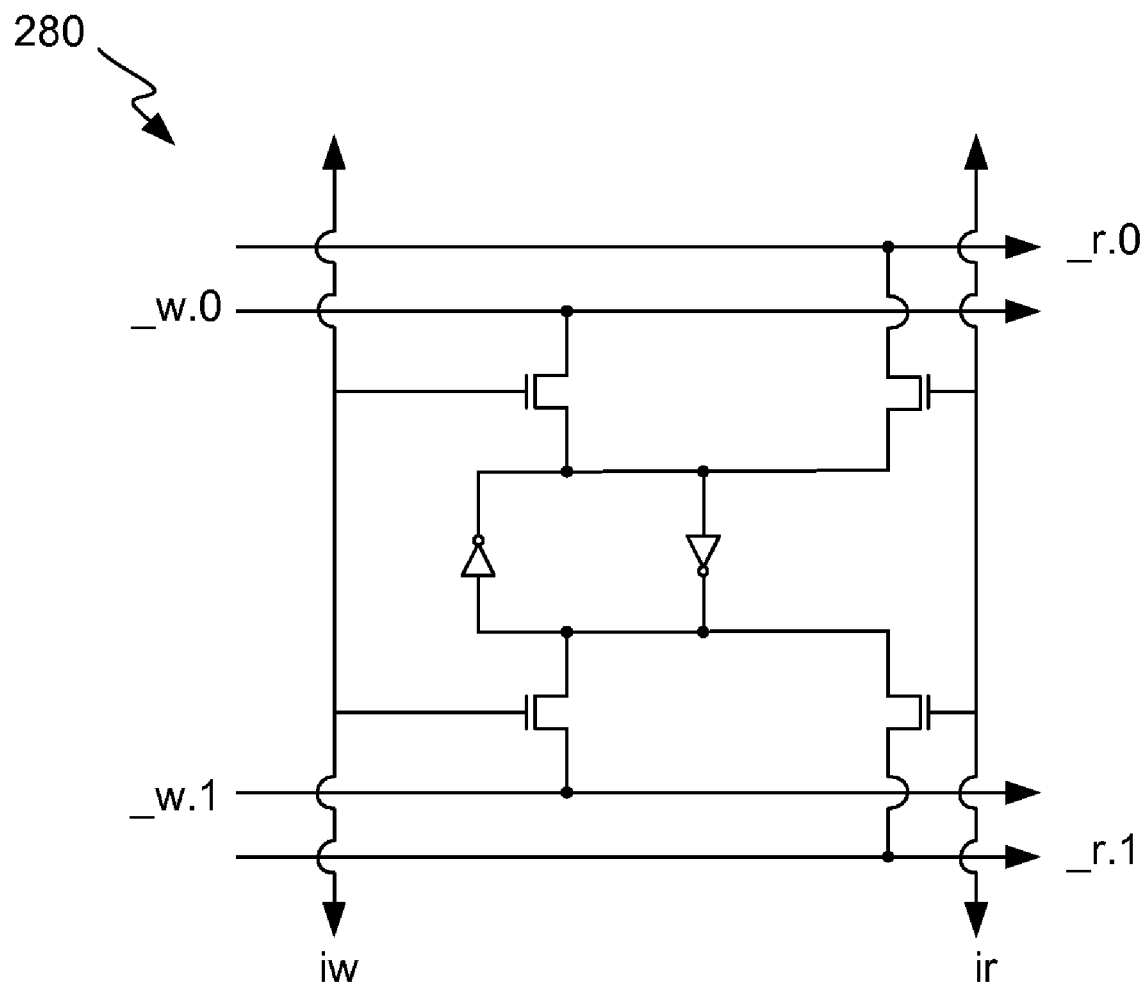

Examples of single and dual-ported SRAM cells suitable for use with various embodiments of the invention are shown in FIGS. 2A through 2C. FIG. 2A illustrates a six-transistor (6T) SRAM state element 200 that includes a pair of cross-coupled inverters 202 and 204 with transistor pass gates 206 and 208 connected to corresponding bit lines b.0 and b.1. An address or word line 210 is operable to turn on pass gates 206 and 208 thereby exposing the bit lines to the states on the internal nodes x.0 and x.1 of the SRAM state element. Bit lines b.0 and b.1 can be thought of as a dual-rail representation of the data stored in SRAM state element 200.

To read the state of SRAM state element 200, address or word line 210 is used to turn on transistor pass gates 206 and 208 to connect bits lines b.0 and b.1 (which are pre-charged high) to internal nodes x.0 and x.1, respectively. The internal node which is low pulls the corresponding bit line low which is sensed, with the dual rail value then being buffered and sent to the requester. To write to SRAM state element 200, address or word line 210 is again used to expose the internal nodes to the bit lines which are then driven with the desired write values, overpowering the transistors in the cross-coupled inverters 202 and 204 to establish the new internal state of the state element.

FIG. 2B illustrates a ten transistor (10T) dual-ported SRAM state element 250 in which two buses are employed, one for writing and one for reading. That is, write bus lines _w.0 and _w.1 are used in conjunction with address or word line iw for writing to state element 250, while read bus lines _r.0 and _r.1 are used in conjunction with address or word line it for reading from state element 250. As compared to the 6T state element of FIG. 2A, the 10T state element requires more die area, but is considerably faster. In addition, because of the separate read and write buses, substantially simultaneous read and write operations to different addresses in the same SRAM bank are possible.

An 8T dual-ported state-bit can also be used to build dual-ported SRAM. FIG. 2C illustrates such an eight transistor (8T) dual-ported SRAM state element 280 similar in function and topology to the state element of FIG. 2B which may be used with various embodiments of the invention.

According to specific embodiments, each "stripe" or entry in the SRAM banks of the main memory (e.g., XXXXSTRIPE0XXXXX) maps to the corresponding stripe or entry in the sideband memory. For example, stripe 0 in Bank 0 maps to stripe 0 in the sideband memory. Similarly, stripe 0 in Bank 1 maps to stripe 0 in the sideband memory, and so on. Obviously, only one entry corresponding to one of the main memory banks can be stored in the sideband memory at a given time. According to various embodiments, a pattern of access to the information stored in the main memory SRAM banks is facilitated using the sideband memory such that SRAM 102 operates as if it were a fully provisioned dual-ported memory.

According to various embodiments, each entry or stripe in the sideband memory stores a copy of the corresponding entry for any one of Banks 0 through B-1 at any given time. According to a particular class of embodiments and as will be discussed, the decision as to whether to direct a particular operation to the main memory SRAM banks or the sideband memory is completely deterministic. Unlike memories which rely on statistical behavior to achieve higher throughput, memories implemented according to various embodiments of the present invention eliminate the risk of dropping packets due to memory access conflicts. A brief discussion of different scenarios for simultaneous read and write operations will be instructive.

In a first case, the read and the write operations are both directed to the sideband memory. Therefore, both operations may be conducted in parallel because the sideband memory is dual-ported.

In a second case, one of the operations (i.e., the read or the write) is directed to an entry stored in the sideband memory, and the other (i.e., the write or the read) is directed to an entry in the main memory. Again, both operations may be performed in parallel because the sideband memory can handle one while the main memory handles the other.

In a third case, neither of the entries to which the two operations are directed is stored in the sideband memory, but the operations are directed to different banks in main memory. As long as there are parallel read and write buses as mentioned above, both operations may be performed in the main memory without conflict.

The interesting case occurs when the two operations are directed to entries in the same bank, and neither of those entries is stored in the sideband memory. According to specific embodiments of the invention, when this case is detected, it is handled by directing the read operation to the main memory and the write operation to the sideband memory. This is accomplished with simultaneous reads and writes in both the main memory and the sideband memory. The manner in which this is achieved is as follows.

In this case, the entry in the sideband memory that is being overwritten belongs to a different bank than the one to which the write operation is directed because otherwise the write would just overwrite its own entry in the sideband memory. In addition, the entry that is being overwritten in the sideband memory may simultaneously be read from the sideband memory and written back to the corresponding location in the main memory in a manner which does not interfere with the first read operation because, the bank in the main memory to which the read operation is directed is different than the one containing the entry being overwritten from the sideband memory. And this simultaneous read operation from the sideband memory is enabled by the fact that it is a dual-ported memory.

As will be understood, the overhead associated with a sideband memory implemented in accordance with embodiments of the invention is proportional to the size of the banks in the main memory, i.e., the larger the main memory banks, the larger the sideband memory. Thus, in terms of the overall area penalty, embodiments of the invention are particularly advantageous where the main memory has a large number of banks and/or a relatively small bank size.

Figure 4:
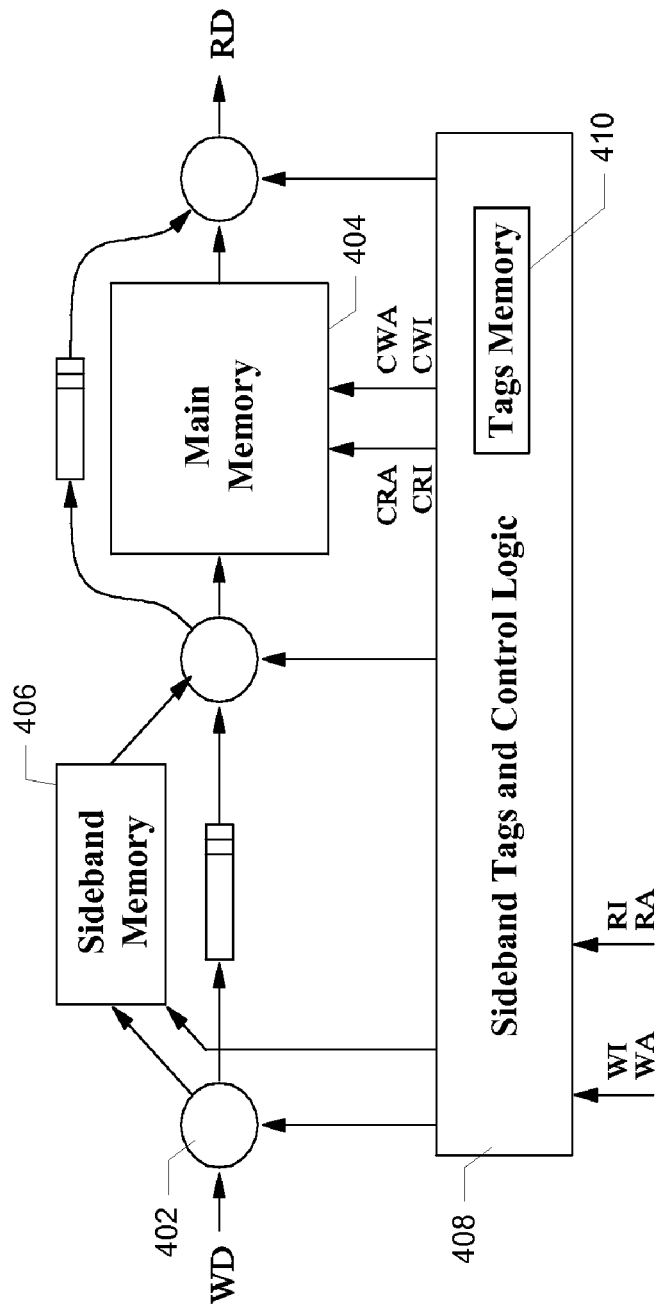
FIG. 4 is a block diagram of an SRAM implemented according to a specific embodiment of the invention.

A more detailed representation of a particular implementation is shown in FIG. 4. As shown, the write channel carrying the write data (WD) goes into a small switching element 402 which sends the write data either to the main memory 404 or the sideband memory 406.

Sideband tags and control logic 408 receives the write and read addresses (WA and RA) and write and read instruction signals (WI and RI), and controls the various crossbars (e.g., XBAR 402) and memories accordingly (e.g., providing corresponding write and read address (CWA and CRA) and corresponding write and read instruction (CWI and CRI) signals to main memory 404). Sideband tags and control logic 408 includes a sideband tags memory 410 which stores a bank number for each entry in sideband memory 406, i.e., indicates which bank in main memory 404 corresponds to each of the entries in sideband memory 406. So, for example, if there are 64 banks in the main memory, each entry in the sideband memory is represented by 6-bits identifying the bank in main memory to which the entry corresponds.

The SRAM banks in main memory 404 are single-ported (allowing only a read or a write in a given cycle) while the sideband memory is dual-ported (allowing both a read and a write in a given cycle). According to one set of embodiments, the sideband tags memory in sideband tags and control logic 408 is triple-ported so that it can perform two reads and a write each cycle. That is, two reads of two different indices in the sideband tags memory occur each cycle, i.e., one for each of the two memory operations directed to the banks in main memory 404. In addition, in cases where an entry in sideband memory 406 is overwritten, the corresponding entry in the sideband tags memory is also modified. It will be understood that, if each bank in the main memory is N entries by W bits, the size of the memory in the sideband tags block is N×[log$_2$B], where B is the number of banks in the main memory.

The implementation described above enables the performance of a dual-ported memory using single-ported memory banks and some additional overhead at a fraction of the 2 to 3 times area penalty represented by dual-ported design of equivalent frequency built with dual-ported 8T or 10T statebits (memory cells).

Figure 5:
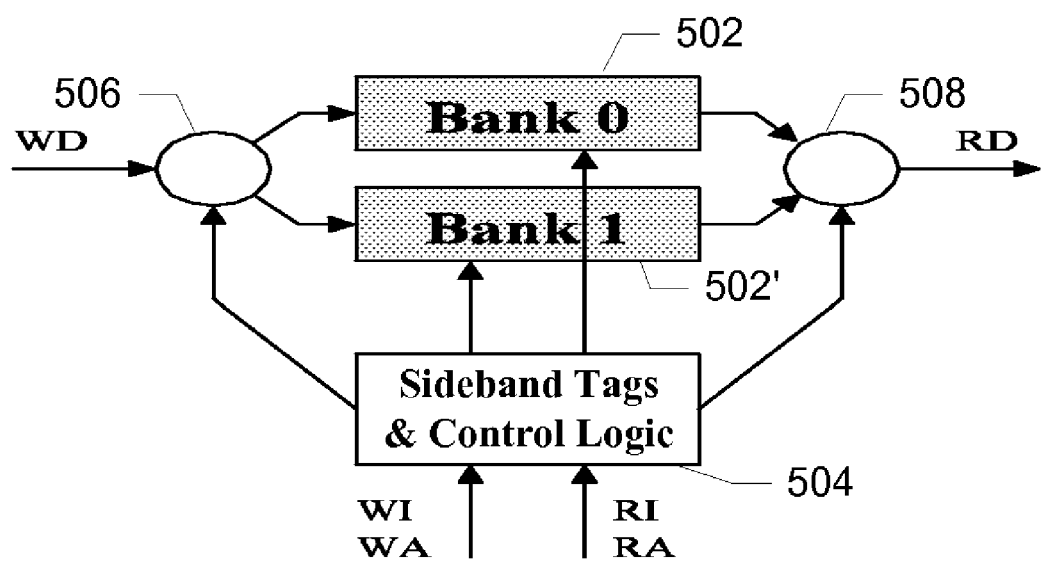
FIG. 5 is a block diagram of a portion of an SRAM implemented according to a specific embodiment of the invention.

According to an alternative approach shown in FIG. 5, a similar concept to the sideband memory may be employed that does not realize the same kind of area savings as the embodiments described above, but may still be smaller than a dual-ported SRAM. As with the embodiments described above, this implementation is completely deterministic and does not need to rely on statistical performance.

In this implementation, the single-ported main memory is duplicated (502 and 502') such that there are now two possible locations for each entry in memory to be stored. As will be understood, even though this more than doubles the size of the memory relative to a single-ported implementation, the area penalty may still be less than an implementation using dual-ported cells.

For each corresponding pair of entries at the same location in each pair of banks, sideband tags and control logic 504 tracks which of the banks has the current value. Sideband tags and control logic 504 directs all read operations to the banks with the current values for the entries to which the reads are directed. During a simultaneous read and write, sideband tags and control logic 504 directs the write operation to the bank not being read. The bank so written then contains the current value.

To track which bank has the current value, sideband tags and control logic 504 has one bit for each of the N entries in banks 502 and 502' identifying which of the two banks has the current value for the corresponding entry. Using this information, sideband tags and control logic 504 controls crossbars 506 and 508 to direct the read and write operations to the appropriate bank. Each time a particular entry is overwritten in one of the banks, the corresponding entry in sideband tags and control logic 504 is modified to reflect the change. According to a particular implementation, the memory in sideband tags and control logic 504 is a dual-ported memory to enable it to perform both a read operation (i.e., to identify to which bank the incoming read operation should be directed), and a write operation (i.e., to modify the entry corresponding to the incoming write operation to reflect the new current bank) during the same cycle.

Figure 6:
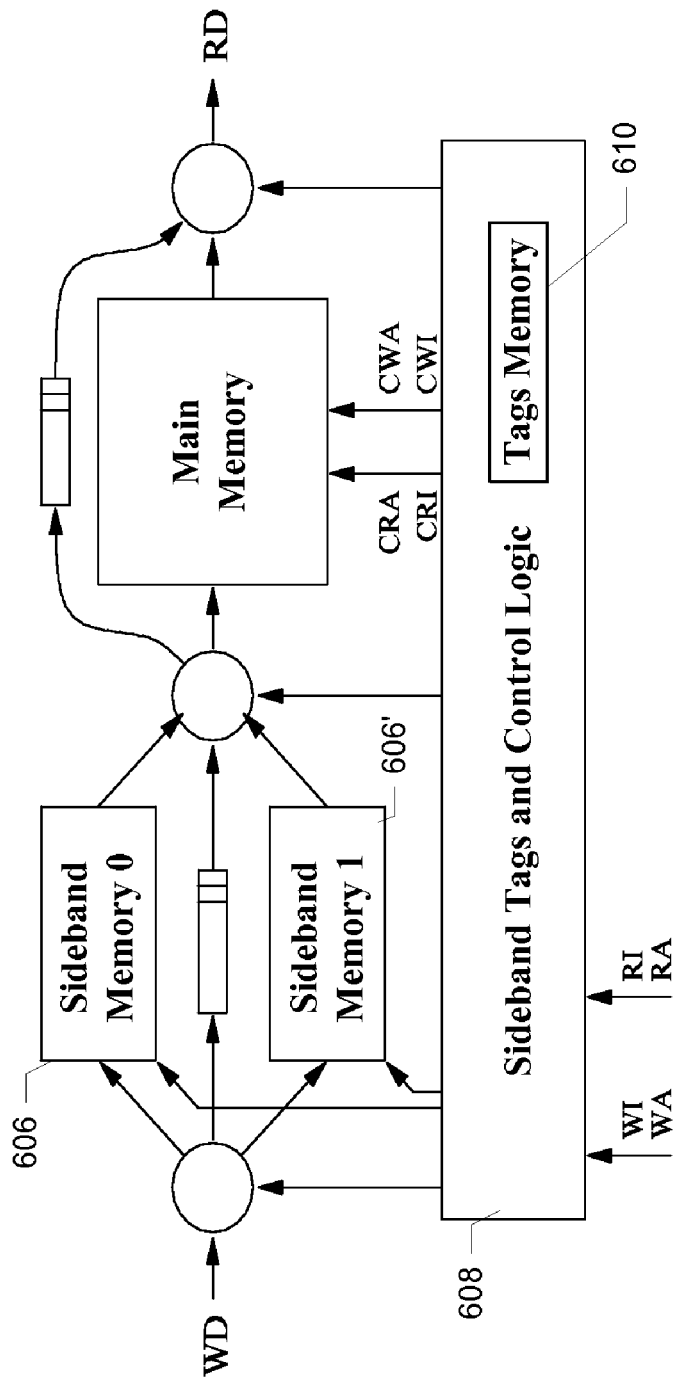
FIG. 6 is a block diagram of an SRAM implemented according to another specific embodiment of the invention.

A specific class of embodiments represents a refinement of the embodiment of FIG. 4 in which the approach described with reference to FIG. 5 is used to implement the sideband memory. That is, as shown in FIG. 6, the dual-ported sideband memory 406 described above with reference to FIG. 4 may be implemented using two parallel single-ported memories 606 and 606'. This may be achieved by adding one bit to each entry in the N-entry sideband tags memory (i.e., $N \times [(\log_2 B)+1]$) in sideband tags and control logic 408 to track which of the single-ported sideband memories has the current value, and then updating sideband tags and control logic 408 to operate as described above with reference to FIG. 5 (resulting in sideband tags and control logic 608 and sideband tags memory 610). This approach has the advantage that the single-ported SRAM banks used to implement the sideband memory may be identical to the single-ported SRAM banks in the main memory.

An additional refinement along similar lines may be used to implement an alternative to the triple-ported sideband tags memory 410 using two dual-ported memories. That is, instead of two parallel single-ported memories as described with reference to FIG. 5, the parallel memories are instead dual-ported to support one read operation and one write operation each cycle. Any changes are written to both of these tags memories so that they always contain identical values. The duplication allows the two reads to occur in parallel, one using each tags memory bank. That is, write operations involve writing the same value to the same location in both memories. One of the read operations each cycle is performed on one of the parallel dual-ported memories, and the other read operation is performed on the other.

While the invention has been particularly shown and described with reference to specific embodiments thereof, it will be understood by those skilled in the art that changes in the form and details of the disclosed embodiments may be made without departing from the spirit or scope of the invention. For example, embodiments have been described herein in which the underlying memory technology is SRAM. However, it should be understood that the techniques described herein may be employed to implement memory systems using any type of memory technology which may suffer from limitations similar to those described above, and to which various embodiments of the invention are directed. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A memory system, comprising:
   a main memory comprising a plurality of single-ported memory banks, each memory bank comprising a first number of entries;
   parallel busses configured to enable simultaneous writing to and reading from different ones of the single-ported memory banks;
   a sideband memory comprising the first number of entries, each of the entries in the sideband memory mapping to a corresponding one of the entries in one of the memory banks in the main memory, the sideband memory being configured to allow parallel read and write accesses to the sideband memory per cycle;
   switching circuitry configured to direct read and write operations to either the main memory or the sideband memory; and
   control logic configured to track to which of the memory banks in the main memory each of the entries in the sideband memory corresponds, and to deterministically control the switching circuitry in response to memory address information to effect a pattern of access to the main memory and the sideband memory such that the memory system performs like a fully provisioned dual-ported memory, wherein when a read operation and a write operation simultaneous with the read operation are both directed to entries in a first one of the single-ported memory banks in the main memory that are not present in the sideband memory, the control logic is further configured to direct the read operation to the first single-ported memory bank in the main memory and the write operation to the sideband memory.

2. The memory system of claim 1 wherein each of the memory banks in the main memory comprises a plurality of single-ported six transistor (6T) static random access memory (SRAM) cells.

3. The memory system of claim 1 wherein the sideband memory comprises a dual-ported array.

4. The memory system of claim 3 wherein the dual-ported array comprises a plurality of dual-ported static random access memory (SRAM) cells, wherein the SRAM cells are either ten transistor (10T) SRAM cells or eight transistor (8T) SRAM cells.

5. The memory system of claim 1 wherein the sideband memory comprises first and second single-ported arrays in parallel, each of the arrays having the first number of entries, both of each corresponding pair of entries in the first and second single-ported arrays mapping to the corresponding one of the entries in one of the memory banks in the main memory, only one of each corresponding pair of entries in the first and second single-ported arrays being valid, the control logic further being configured to track which of each corresponding pair of entries is valid.

6. The memory system of claim 5 wherein the control logic comprises a tags memory that identifies the memory bank in the main memory to which each pair of corresponding entries in the sideband memory corresponds, the tags memory further identifying which of each corresponding pair of entries is valid.

7. The memory system of claim 1 wherein the control logic comprises a tags memory that identifies the memory bank in the main memory to which each of the entries in the sideband memory corresponds, the tags memory being configured to allow three memory accesses to the tags memory per cycle.

8. The memory system of claim 7 wherein the tags memory comprises a triple-ported array.

9. The memory system of claim 7 wherein the tags memory comprises first and second dual-ported arrays in parallel, each of the arrays having the first number of entries, wherein write operations to the tags memory write the same value to both of each corresponding pair of entries in the first and second dual-ported arrays, and wherein first and second simultaneous read operations read from the first and second dual-ported arrays, respectively.

10. A shared-memory switch, comprising:
   a plurality of receive ports;
   a plurality of transmit ports;
   a memory system comprising:
      a main memory comprising a plurality of single-ported memory banks, each memory bank comprising a first number of entries;
      parallel busses configured to enable simultaneous writing and reading from different ones of the single-ported memory banks;
      a sideband memory comprising the first number of entries, each of the entries in the sideband memory mapping to a corresponding one of the entries in one of the memory banks in the main memory, the sideband memory being configured to allow parallel read and write accesses to the sideband memory per cycle;

switching circuitry configured to direct read and write operations to either the main memory or the sideband memory; and control logic configured to track to which of the memory banks in the main memory each of the entries in the sideband memory corresponds, and to deterministically control the switching circuitry in response to memory address information to effect a pattern of access to the main memory and the sideband memory such that the memory system performs like a fully provisioned dual-ported memory, wherein when a read operation and a write operation simultaneous with the read operation are both directed to entries in a first one of the single-ported memory banks in the main memory that are not present in the sideband memory, the control logic is further configured to direct the read operation to the first single-ported memory bank in the main memory and the write operation to the sideband memory;

receive crossbar circuitry operable to connect any of the receive ports with the memory system;

transmit crossbar circuitry operable to connect the memory system with any of the transmit ports; and switching logic which is operable to control interaction of the receive and transmit ports, the receive and transmit crossbar circuitry, and the memory system to effect storage and retrieval of data in the memory system.

\* \* \* \* \*